United States Patent
Ezaki et al.

(10) Patent No.: US 10,222,051 B2
(45) Date of Patent: Mar. 5, 2019

(54) AUTOMOTIVE LED LAMP HEAT SINK

(71) Applicant: Kaneka Corporation, Osaka (JP)

(72) Inventors: Toshiaki Ezaki, Osaka (JP); Soichi Uchida, Osaka (JP); Kazuaki Matsumoto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 191 days.

(21) Appl. No.: 15/446,457

(22) Filed: Mar. 1, 2017

(65) Prior Publication Data

US 2017/0167716 A1    Jun. 15, 2017

Related U.S. Application Data

(63) Continuation of application No. PCT/JP2015/074315, filed on Aug. 27, 2015.

(30) Foreign Application Priority Data

Sep. 1, 2014  (JP) .................. 2014-177322

(51) Int. Cl.
  *C08K 3/04*    (2006.01)
  *C08K 7/00*    (2006.01)
  (Continued)

(52) U.S. Cl.
  CPC .............. *F21V 29/87* (2015.01); *C08K 3/04* (2013.01); *C08K 7/00* (2013.01); *C08L 67/02* (2013.01);
  (Continued)

(58) Field of Classification Search
  CPC ....... C08L 67/00; C08L 2203/20; C08K 3/04; C08K 2201/016; C08K 7/00; C09K 5/14;
  (Continued)

(56) References Cited

U.S. PATENT DOCUMENTS 6,384,128 B1 *  5/2002  Wadahara ............... C08K 3/04
                                                          524/496
8,915,617 B2 * 12/2014  Negandhi ............... F21V 5/04
                                                        362/249.02
(Continued)

FOREIGN PATENT DOCUMENTS

JP    2001060413 A    3/2001
JP    2010021452 A    1/2010
(Continued)

OTHER PUBLICATIONS

International Search Report issued in International Application No. PCT/2015/074315 with English translation dated Oct. 27, 2015 (5 pages).

*Primary Examiner* — Peggy A Neils
(74) *Attorney, Agent, or Firm* — Osha Liang LLP (57) ABSTRACT

An LED heat sink for vehicles includes an injection molded product of a thermally conductive resin composition. The thermally conductive resin composition includes 50 to 90 weight % of a thermoplastic polyester resin having a number average molecular weight of 12,000 to 70,000, and 10 to 50 weight % of a flaked graphite having a fixed carbon content of at least 98 mass %, and an aspect ratio of at least 21, and the thermally conductive resin composition has a specific gravity of 1.4 to 1.7, and an in-plane thermal conductivity of at least 1 W/(m·K).

17 Claims, 4 Drawing Sheets

(51) Int. Cl.
*C09K 5/14* (2006.01)
*C08L 67/00* (2006.01)
*C08L 67/02* (2006.01)
*F21S 45/47* (2018.01)
*F21V 29/76* (2015.01)
*F21V 29/87* (2015.01)
*H01L 33/64* (2010.01)
*F21Y 115/10* (2016.01)
*H01L 23/367* (2006.01)
*H01L 23/373* (2006.01)

(52) U.S. Cl.
CPC .............. *C08L 67/025* (2013.01); *C09K 5/14* (2013.01); *F21S 45/47* (2018.01); *F21V 29/763* (2015.01); *H01L 33/641* (2013.01); *C08K 2201/016* (2013.01); *C08L 2203/20* (2013.01); *F21Y 2115/10* (2016.08); *H01L 23/367* (2013.01); *H01L 23/3737* (2013.01)

(58) Field of Classification Search
CPC .... F21V 29/763; F21V 29/87; F21Y 2115/10; H01L 23/367; H01L 23/3737; H01L 33/641; F21S 45/47; F21S 48/328
See application file for complete search history.

(56) References Cited

U.S. PATENT DOCUMENTS 9,227,347 B2 * 1/2016 Hardikar ................. B29C 45/14
9,903,579 B2 * 2/2018 Janssen ................... F21V 15/01

FOREIGN PATENT DOCUMENTS

| JP | 4527196 | B2 | 8/2010 |
| JP | 2011016937 | A | 1/2011 |
| JP | 2011061157 | A | 3/2011 |
| JP | 5225558 | B2 | 7/2013 |
| JP | 5302315 | B2 | 10/2013 |
| JP | 2014091826 | A | 5/2014 |
| JP | 2014093427 | A | 5/2014 |
| JP | 2014146575 | A | 8/2014 |

* cited by examiner

AUTOMOTIVE LED LAMP HEAT SINK

TECHNICAL FIELD

One or more embodiments of the present invention relates to automotive LED lamp heat sinks that employ thermally conductive resins. One or more embodiments of the present invention also relate to an automotive LED lamp heat sink that is of specific gravity lower than that of an automotive LED lamp heat sink that employs metals and can contribute to weight reduction and energy saving.

BACKGROUND

The downsizing and higher-level integration of electrical and electronic equipment has been accompanied by pronounced heat emission from the mounted electrical and electronic parts and by temperature elevation of the operating environment, such that demand for improvement in the dissipation of heat from the constituent components has been on the rise. For heat dissipation in automotive member and high-power LEDs especially, components composed of metals and ceramics of high thermal conductivity are currently used. In a conventional automotive LED lamp heat sink that is one of the heat-dissipating components, general-purpose resins, or metals having a high thermal conductivity, such as aluminum, are used. In the case of general-purpose plastics, however, the thermal conductivity is low, prohibiting sufficiently cooling the LED module. And in the case of metals such as aluminum, with the specific gravity being large, post processing steps are required in order to enhance the heat dissipation properties. In addition, on account of the metals being manufactured by die casting or extrusion molding, there have been issues including low degrees of freedom in shape, high manufacturing costs, and poor die durability. For this reason, a resin material that has high thermal conductivity, lightened weight, and superior molding workability, and that can be manufactured at low cost has been sought.

As a way of imparting thermal conductivity to a resin, a technique of adding a filer of high thermal conductivity, such as graphite, has been disclosed.

In Patent Document 1, a resin composition excelling in thermal conductivity by adding specific graphite particles having an aspect ratio of 10 to 20, a weight-average particle size of 10 to 200 μm, and a fixed carbon content of 98 mass % or more to a thermoplastic resin is disclosed.

Patent Document 2 discloses an electro conductive resin composition including a thermoplastic resin and graphite powder in which the aspect ratio of 70% or more of the particles is three or less.

Patent Document 3 discloses an LED lamp heat sink in which a thermally conductive resin containing a thermoplastic resin and one or more fillers selected from metals, inorganic substances, carbon fibers, and graphite, is combined with either a metal or carbon material of high thermal conductivity. The technologies described above, however, require dense charging with graphite or other fillers in order to impart thermal conductivity, and thus have had issues of the fluidity being extremely degraded and, depending on the situation, molding proving difficult. What is more, regarding automotive LED lamp heat sinks application, the lamp lens not clouding when exposed to high temperatures is given as a required physical property, and anti-fogging properties are demanded, yet these points are not discussed in the above-noted patent documents at all. Nor is there discussion of ultrasonic weldability in compositing a metal or plastic base material with a thermally conductive resin.

CITATION LIST

Patent Literature

Patent Document 1: JP 5225558 B
Patent Document 2: JP 2001-60413 A
Patent Document 3: JP 2011-61157 A

SUMMARY

One or more embodiments of the present invention provide an automotive LED lamp heat sink that is of superior thermal conductivity, molding processability, anti-fogging properties, and ultrasonic weldability with metals and resins, and that is lightweight and can be fabricated at low cost.

As the cumulative result of intensive investigative efforts to resolve the issues discussed above, the present inventors found out, thermally conductive resin composition in which graphite having a specific form is contained in a specific thermoplastic polyester excels in thermal conductivity, molding processability, anti-fogging properties, and ultrasonic weldability with metals and resins, which is highly applicable to an automotive LED lamp heat sink.

One or more embodiments of the present invention provides the following features (1) through (16).

(1) An automotive LED lamp heat sink that is a heat sink for cooling an LED module a part or whole of which is formed by injection molding of a thermally conductive resin composition, and the thermally conductive resin composition includes at least (A) 50 to 90 weight % of a thermoplastic polyester resin having a number average molecular weight of 12,000 to 70,000 (hereinafter also referred to as a "thermoplastic polyester resin (A)") and (B) 10 to 50 weight % of flaked graphite having a fixed carbon content of 98 mass % or more and an aspect ratio of 21 or more (hereinafter also referred to as a "flaked graphite (B)"), and has a specific gravity of 1.4 to 1.7 and an in-plane thermal conductivity of 1 W/(m·K) or more.

(2) In the automotive LED lamp heat sink described in (1), the flaked graphite (B) included in the LED lamp heat sink has a volume average particle size of 1 to 500 μm.

(3) In the automotive LED lamp heat sink described in (1) or (2), the thermally conductive resin composition is produced by melting and kneading and flaked graphite before the melting and kneading has a volume average particle size of 1 to 700 μm, a fixed carbon content of 98 mass % or more, and an aspect ratio of 21 or more.

(4) In the automotive LED lamp heat sink described in any one of (1) to (3), the thermoplastic polyester resin (A) is one or more resins selected from the group consisting of polybutylene terephthalate, polyethylene terephthalate, and polyester-polyether copolymers.

(5) In the automotive LED lamp heat sink described in any one of (1) to (4), the thermally conductive resin composition has a thru-plane thermal conductivity of 0.5 W/(m·K) or more.

(6) In the automotive LED lamp heat sink described in any one of (1) to (5), a part of the LED lamp heat sink is a highly thermally conductive metal or a carbon material.

(7) In the automotive LED lamp heat sink described in any one of (1) to (5), the LED lamp heat sink includes, being formed from a highly thermally conductive metal and the thermally conductive resin composition, on a heat receiving surface thereof, composed from the thermally conductive resin composition, is fixedly joined to the highly thermally conductive metal by insert molding, ultrasonic welding, or thermal welding.

(8) In the automotive LED lamp heat sink described in (6) or (7), the highly thermally conductive metal is a metal selected from the group consisting of aluminum, copper, magnesium, and an alloy of at least two of aluminum, copper, and magnesium, and has a thermal conductivity of 40 W/(m·K) or more.

(9) In the automotive LED lamp heat sink described in (6), the carbon material is a graphite sheet, and has an in-plane thermal conductivity of 500 W/(m·K) or more.

(10) In the automotive LED lamp heat sink described in any one of (1) to (9), the automotive LED lamp heat sink utilizes a thermal interface material whose thermal conductivity is 0.5 W/(m·K) or more, and is constituted by: the highly thermally conductive metal—thermal interface material—the thermally conductive resin composition.

(11) In the automotive LED lamp heat sink described in any one of (1) to (10), a portion of the automotive LED lamp heat sink is made of a resin composition including an insulating resin.

(12) In the automotive LED lamp heat sink described in any one of (1) to (11), a ratio of the heat sink's base-portion thickness to interior gate thickness of a die for injection molding of the automotive LED lamp heat sink (base-portion thickness/gate thickness) is two or more.

(13) In the automotive LED lamp heat sink described in any one of (1) to (12), the automotive LED lamp heat sink includes two or more gate marks.

(14) An automotive LED rear-lamp heat sink as set forth in any one of (1) to (13).

(15) An automotive LED front-lamp heat sink as set forth in any one of (1) to (13).

(16) An automotive LED head-lamp heat sink s set forth in any one of (1) to (13).

The automotive LED lamp heat sink described in any one of (1) to (16) can also be, for example, described as follows:

(1) An automotive LED lamp heat sink includes a member of an injected molded article including a thermally conductive resin composition, and the thermally conductive resin composition includes (A) 50 to 90 weight % of a thermoplastic polyester resin having a number average molecular weight of 12.000 to 70,000 and (B) 10 to 50 weight % of flaked graphite having a fixed carbon content of 98 mass % or more and an aspect ratio of 21 or more, and has a specific gravity of 1.4 to 1.7 and an in-plane thermal conductivity of 1 W/(m·K) or more.

(2) In the automotive LED lamp heat sink described in (1), the flaked graphite (B) has a volume average particle size of 1 to 500 μm.

(3) In the automotive LED lamp heat sink described in (1) or (2), the thermally conductive resin composition is a melted and kneaded product, and flaked graphite before the melting and kneading has a volume average particle size of 1 to 700 μm, a fixed carbon content of 98 mass % or more, and an aspect ratio of 21 or more.

(4) In the automotive LED lamp heat sink described in any one of (1) to (3), the thermoplastic polyester resin (A) is one or more resins selected from the group consisting of polybutylene terephthalate, polyethylene terephthalate, and polyester-polyether copolymers.

(5) In the automotive LED lamp heat sink described in any one of (1) to (4), the thermally conductive resin composition has a thru-plane thermal conductivity of 0.5 W/(m·K) or more.

(6) The automotive LED lamp heat sink described in any one of (1) to (5) further includes a member of at least one type of a highly thermally conductive material selected from the group consisting of a metal and a carbon material.

(7) The automotive LED lamp heat sink described in any one of (1) to (5) is a joined article in which a heat receiving surface of the heat sink as a member of an injected molded article including a thermally conductive resin composition and a member of a highly thermally conductive material are bonded by insert molding, ultrasonic welding, or thermal welding.

(8) In the automotive LED lamp heat sink described in (6) or (7), the metal is at least a metal selected from the group consisting of aluminum, copper, magnesium, and an alloy of at least two of aluminum, copper, and magnesium, and has a thermal conductivity of 40 W/(m·K) or more.

(9) In the automotive LED lamp heat sink described in (6), the carbon material is a graphite sheet having an in-plane thermal conductivity of 500 W/(m° K) or more.

(10) The automotive LED lamp heat sink described in any one of (6) to (9) further includes a thermally conductive layer of a thermal interface material whose thermal conductivity is 0.5 W/(m·K) or more, and the thermally conductive layer is interposed between the member of the injected molded article including the thermally conductive resin composition and the member of the highly thermally conductive material.

(11) The automotive LED lamp heat sink described in any one of (1) to (10) further includes a member of an insulating material.

(12) In the automotive LED lamp heat sink described in any one of (1) to (11), a ratio of the LED lamp heat sink's base-portion thickness to interior gate thickness for injecting a thermally conductive resin composition into a die for injection molding of the automotive LED lamp heat sink (base-portion thickness/gate thickness) is two or more.

(13) The automotive LED lamp heat sink described in any one of (1) to (12) includes two or more gate marks.

(14) The automotive LED lamp heat sink described in any one of (1) to (13) is used for a rear lamp.

(15) The automotive LED lamp heat sink described in any one of (1) to (13) is used for a front lamp.

(16) The automotive LED lamp heat sink described in any one of (1) to (13) is used for a head lamp.

An automotive LED lamp heat sink according to one or more embodiments of the present invention includes a specific thermoplastic polyester resin (A) and specific graphite particles (B), and thus, has high thermal conductivity, high molding processability (flowability), and excellent ultrasonic weldability with a metal and a resin, is lightweight, and can be manufactured at low costs.

DETAILED DESCRIPTION

An automotive LED lamp heat sink according to one or more embodiments of the present invention is a heat sink partially or entirely formed by injection molding using a thermally conductive resin composition described later and used for cooling a light emitting diode (LED) module, and may be any heat sink that at least partially includes a fin.

Specifically, the automotive LED lamp heat sink according to one or more embodiments of the present invention (hereinafter also referred to as a "heat sink") is partially or entirely constituted by an injection molded product of a thermally conductive resin composition (hereinafter also referred to as a "resin composition") described later and including a thermoplastic polyester resin (A) and flaked graphite (B). More specifically, an injection molded product having a desired shape is obtained by melting and kneading the thermally conductive resin composition, or pelletizing the melted and kneaded product and injection molding the pelletized product. The obtained injection molded product may be used as a part or whole of the automotive LED lamp heat sink.

The automotive LED lamp heat sink can be used for various LED lamps for vehicles. LED lamps for vehicles are generally classified into an interior lamp and an exterior lamp. Examples of the interior lamp include a room lamp, and a map lamp. Examples of the exterior lamp include a rear lamp, a front lamp, and a head lamp. Specific examples of the rear lamp include a tail lamp, a stop lamp, a rear turn signal lamp, a rear fog lamp, a high mounted stop lamp, a back lamp, and a number plate lamp. Specific examples of the front lamp include a front fog lamp, a front turn signal lamp, a front positioning lamp, a side turn signal lamp, a day lamp, and a fashion lamp. Among these LED lamps for vehicles, a high luminance LED module is used, and from the viewpoint of a demand for heat dissipation, a rear lamp, a front lamp, and a head lamp may be used, and a tail lamp, a stop lamp, a fog lamp, a positioning lamp, a turn signal lamp, a day lamp, and a head lamp also may be used.

Power consumption of one LED in an LED lamp for vehicles differs among applications, and a plurality of LED modules are used in some cases. In general, a rear lamp and a front lamp may use LED modules of 0.1 to 15 W, such as 0.1 to 10 W, such as 0.1 to 8 W, such as 0.1 to 5 W, or such as 0.1 to 3 W. A head lamp may use an LED module of 1 W or more, such as 5 to 40 W, such as 10 to 30 W, such as 10 to 25 W, or such as 10 to 20 W.

Examples of the thermoplastic polyester resin (A) according to one or more embodiments of the present invention include noncrystalline polyester-based resins such as noncrystalline semi aromatic polyester and noncrystalline fully aromatic polyester and crystalline polyester-based resins such as crystalline semi aromatic polyester and crystalline fully aromatic polyester. These thermoplastic polyesters may be used singly, or two or more of the thermoplastic polyesters may be used in combination.

The thermoplastic polyester resin (A) may be a thermoplastic resin a part or whole of which is crystalline or liquid crystalline because such a thermoplastic resin tends to provide a high thermal conductivity of an obtained resin composition and enables the flaked graphite (B) to be easily included in the resin. These crystalline or liquid crystalline thermoplastic resin may be entirely crystalline or partially crystalline or liquid crystalline in such a state that only a specific block in molecules of a block or graft copolymer resin is crystalline or liquid crystalline. The degree of crystallinity of the resin is not limited to a specific degree. As the thermoplastic resin, a polymer alloy of a noncrystalline resin and a crystalline or liquid crystalline resin may be used.

Some thermoplastic resins each of which is partially or entirely crystalline or liquid crystalline are noncrystalline when such resins are used solely or molded in specific molding conditions, although the resins can be crystallized. In the case of using such a resin, a part or whole of the resin can be crystallized in some cases by devising a molding process, for example, by performing an extension process or a post crystallization process.

Specific examples of the crystalline polyester include polyethylene terephthalate, polypropylene terephthalate, polybutylene terephthalate, polyethylene-2,6-naphthalate, polybutylene naphthalate, poly 1,4-cyclohexylenedimethylene terephthalate, and polyethylene-1,2-bis(phenoxy)ethane-4,4'-dicarboxylate, and crystalline copolymer polyesters such as polyethylene isophthalate/terephthalate, polybutylene terephthalate/isophthalate, polybutylene terephthalate/decane dicarboxylate, polycyclohexane dimethylene terephthalate/isophthalate, and polyester/polyether.

From the viewpoints of moldability and thermal resistance, the polyester/polyether (hereinafter referred to as a polyester-polyether copolymer) may be a polymer including 50 to 80 weight % of an aromatic polyester unit and 20 to 50 weight % of a modified polyether unit described later and represented by General Formula (1) below, and may be a polymer including 60 to 80 weight % of an aromatic polyester unit and 20 to 40 weight % of the modified polyether.

General Formula 1

In General Formula 1, -A- is —O—, —S—, —SO—, —SO$_2$—, —CO—, an alkylene group having 1 to 20 carbon atoms or an alkylidene group having 6 to 20 carbon atoms, $R^1$, $R^2$, $R^3$, $R^4$, $R^5$, $R^6$, $R^7$, and $R^8$ are hydrogen atoms, halogen atoms, or a monovalent hydrocarbon group having 1 to 5 carbon atoms, and $R^9$ and $R^{10}$ are divalent hydrocarbon groups each having 1 to 5 carbon atoms, which may be identical or different groups, and m and n are the numbers of repeating oxyalkylene units, and $2 \leq m+n \leq 50$.

Examples of a method for producing the polyester-polyether copolymer include, but are not limited to (1) a direct esterification method of three substances of aromatic dicarboxylic acid, diol, modified polyether, (2) a transesterification method of three substances of aromatic dicarboxylic acid dialkyl, diol, modified polyether, and/or ester of modified polyether, (3) a method of adding modified polyether during or after transesterification of aromatic dicarboxylic acid dialkyl and diol and then performing polycondensation, and (4) a method of using high molecular aromatic polyester, mixing the aromatic polyester with modified polyether, and then performing transesterification under a melting and reduced pressure, using a catalyst supplemented with an antimony compound and, depending on the case, a germanium compounds. From the viewpoint of controllability of a material composition, the method (4) may be employed.

Examples of the antimony compound used as a catalyst according to one or more embodiments of the present invention include antimony trioxide, antimony pentoxide, antimony acetate, and antimony glycoxide. These compounds may be used singly or two or more of them may be used in combination. Among these antimony compounds, antimony trioxide may be used. The catalyst amount of an antimony compound added in polymerization may be 50 to 2000 ppm by weight, such as 100 to 1000 ppm by weight, of the total amount of a monomer compound or a raw material resin, from the viewpoints of a reaction rate and economy.

Examples of the germanium compound used as the catalyst include germanium oxides such as germanium dioxide, germanium alkoxides such as germanium tetraethoxide and germanium tetraisopropoxide, germanium hydroxide and its alkali metal salts, germanium glycolate, germanium chloride, and germanium acetate. These germanium compounds may be used singly or two or more of them may be used in combination. Among these germanium compounds, germanium dioxide may be used. The catalyst amount of germanium dioxide added in polymerization may be 50 to 2000 ppm by weight, such as 100 to 1000 ppm by weight, of the amount of the resin, from the viewpoints of a reaction rate and economy.

The aromatic dicarboxylic acid used in the production method (1) may be terephthalic acid, and may be isophthalic add, diphenyl dicarboxylic acid, and diphenoxy ethane dicarboxylic acid, for example. In addition to these aromatic dicarboxylic acids, another aromatic oxycarboxylic acid such as oxybenzoic acid, or an aliphatic or alicyclic dicarboxylic acid such as adipic acid, sebacic acid, or cyclohexane-1,4-dicarboxylic acid may be co-used in a small ratio (15% or less).

The diol used in the production methods (1) to (3) is a low molecular weight glycol component forming ester units, and may include low molecular weight glycols having 2 to 10 carbon atoms such as ethylene glycol, trimethylene glycol, tetramethylene glycol, hexanediol, decanediol, and cyclohexanedimethanol, for example. Ethylene glycol, trimethylene glycol, and tetramethylene glycol may be used because they can be easily obtained.

A methyl group may be used as the alkyl group in the aromatic dicarboxylic acid dialkyl used in the production methods (2) and (3) from the viewpoint of transesterification.

With respect to the solution viscosity of the aromatic polyester in the polymer used in the production method (4), the logarithmic viscosity (IV), determined in a mixed solvent of phenol/tetrachloroethane=111 (weight ratio) at 25° C. at a concentration of 0.5 g/dl, may be within the range from 0.3 to 2.0 such as from 0.5 to 1.5, from the viewpoints of impact resistance, chemical resistance, and molding processability of the obtained molded product.

Aromatic Polyester Unit

The aromatic polyester unit in the polyester-polyether copolymer is a polymer or a copolymer obtained from an aromatic dicarboxylic acid or its derivative capable of producing an ester and diol or its derivative capable of producing an ester, and is typically an alternating polycondensation product. Examples of the aromatic polyester unit may include one or more units selected from the group consisting of a polyethylene terephthalate unit, a polybutylene terephthalate unit, and a polypropylene terephthalate unit.

Examples of the aromatic polyester unit may include polyethylene terephthalate, polyethylene terephthalate copolymers, polybutylene terephthalate, polybutylene terephthalate copolymers, polypropylene terephthalate, and polypropylene terephthalate copolymers, and examples may include one or more units selected from the group consisting of a polyethylene terephthalate unit, a polybutylene terephthalate unit, and a polypropylene terephthalate unit.

Modified Polyether Unit

The modified polyether unit in the polyester-polyether copolymer is a unit represented by General Formula (1) above. The number average of (m+n), where m and n each are the number of repeating oxyalkylene units in General Formula (1), may be 2 to 50, such as 10 to 50, or such as 18 to 50.

General Formula 1

In General Formula (1), -A-, $R^1$, $R^2$, $R^3$, $R^4$, $R^5$, $R^6$, $R^7$, $R^8$, $R^9$, $R^{10}$, m, and n are the same as those described above.

From the viewpoint of availability, the modified polyether unit is a unit represented by General Formula (2) below, and the formula weight is 314 In a case where (m+n) is 2, and is 2426 in a case where (m+n) is 50. Thus, in the case of introducing the unit represented by General Formula (2) as molecules to the polyester-polyether copolymer according to one or more embodiments of the present invention, the molecular weight may be 316 to 2430, such as 670 to 2430, such as 1020 to 2430, or such as 1330 to 2000.

General Formula 2

In General Formula (2), m and n are the same as those described above.

Among these crystalline polyesters, from the viewpoints of molding processability and mechanical properties, polyethylene terephthalate, polypropylene terephthalate, polybutylene terephthalate, polyethylene-2,6-naphthalate, polybutylene naphthalate, poly 1,4-cyclohexylenedimethylene terephthalate, and polyester-polyether copolymers, for example, may be used. From the viewpoints of low costs and high availability, polybutylene terephthalate, polyethylene terephthalate, and the polyester-polyether copolymer may be used. From the viewpoint of excellent ultrasonic welding, polyethylene terephthalate and the polyester-polyether copolymer may be used.

The number average molecular weight herein is a value measured using polystyrene as a standard and a solution in which a sample is dissolved and prepared in a mixed solvent including p-chlorophenol and toluene in a volume ratio of 3:8 in a concentration of 2.5 weight % with a high-temperature GPC (Viscotek: 350 HT-GPC System) at a column temperature of 80° C. and with a differential refractometer (RI) as a detector.

The number average molecular weight of the polybutylene terephthalate, the polyethylene terephthalate, and the polyester-polyether copolymer may be 12,000 to 70,000, such as 15,000 to 60,000, such as 18,000 to 55,000, or such as 20,000 to 40,000. If the number average molecular weight is less than 12,000, mechanical strength can be low in some cases, and if the number average molecular weight is more than 70,000, molding can be difficult in some cases. The automotive LED lamp heat sink according to one or more embodiments of the present invention is produced by melting and kneading the thermoplastic polyester resin (A), the flaked graphite (B), and other components, and then by injection molding the resulting mixture. The number average molecular weight herein may be measured before or after a melting and kneading process or a molding process, and may be measured after the molding process.

Suppose the content of the thermally conductive resin composition is 100 weight %, a content of the thermoplastic polyester resin (A) used in one or more embodiments of the present invention may be 50 to 90 weight %, such as 50 to 80 weight %, or such as 50 to 75 weight %. If the thermoplastic polyester resin (A) is less than 50 weight %, ultrasonic welding and thermal adhesiveness might decrease in combining the resin with a metal or other resins. If the thermoplastic polyester resin (A) exceeds 90 weight %, high thermal conductivity cannot be obtained in some cases.

The flaked graphite (B) used in one or more embodiments of the present invention is graphite particles having specific physical properties. The fixed carbon content may be 98 mass % or more, such as 98.5 mass % or more, or such as 99 mass % or more. If the fixed carbon content is less than 98 mass %, the thermal conductivity decreases. The fixed carbon content can be measured in accordance with JIS M8511. The fixed carbon content does not change before and after a melting and kneading process and a molding process.

The aspect ratio may be 21 or more in a molded article. The upper limit of the aspect ratio may be as high as possible, and is not limited to a specific value. In a case where the aspect ratio has an upper limit, the aspect range may be 1,0000 or less, such as 5,000 or less, or such as 3,000 or less. The aspect ratio of the flaked graphite (B) is obtained as a ratio of a maximum diameter in a surface direction to a minimum thickness (i.e., maximum diameter in surface direction/minimum thickness), and can be calculated by measuring, with, for example, an electron microscope, a maximum diameter in a surface direction and a minimum thickness of any selected 100 flaked graphite particles, and obtaining an arithmetic mean of each type of the measured values.

The flaked graphite (B) used in one or more embodiments of the present invention may be any of natural graphite, artificial graphite, or a combination of natural graphite and artificial graphite, and natural graphite may be used from the viewpoint of availability at low costs. The flaked graphite (B) may be α-graphite, β-graphite, or a combination of the α-graphite or the β-graphite.

As the graphite used in one or more embodiments of the present invention, a graphite having another particle size, shape, and property may be co-used as long as physical properties are not impaired. Examples of a specific shape of the graphite include a fiber shape, a massive shape, a soil shape, and a sphere shape.

Suppose the content of the thermally conductive resin composition according to one or more embodiments of the present invention may be 100 weight %, the content of the flaked graphite (B) may be 10 to 50 weight %, such as 20 to 50 weight %, or such as 25 to 50 weight %.

That is, the thermally conductive resin composition used in the automotive LED lamp heat sink may include 50 to 90 weight % (such as 50 to 80 weight %, such as 50 to 75 weight %) of the thermoplastic polyester resin (A), and 10 to 50 weight % (such as 20 to 50 weight %, such as 25 to 50 weight %) of the flaked graphite (B).

The thermally conductive resin composition may have a specific gravity of 1.4 to 1.7 such as 1.5 to 1.7. If the specific gravity is less than 1.4, thermal conductivity is not sufficiently obtained, leading to the possibility of insufficient heat dissipation.

The in-plane thermal conductivity" herein refers to a thermal conductivity in a direction in which a melted resin flows in forming a molded article. A thermal conductivity in a direction perpendicular to the resin flow direction is defined as a "thermal conductivity in a thickness direction." The in-plane thermal conductivity of the thermally conductive resin composition according to one or more embodiments of the present invention may be 1 W/(m·K) or more, such as 3 W/(m·K) or more, such as 5 W/(m·K) or more, or such as 8 W/(m·K) or more. The upper limit is not limited to a specific value, and the in-plane thermal conductivity may be as high as possible.

The thru-plane thermal conductivity of the thermally conductive resin composition according to one or more embodiments of the present invention is not limited to a specific value, and may be as high as possible. If the thru-plane thermal conductivity has a lower limit, the lower limit may be 0.5 W/(m·K) or more, such as 0.8 W/(m·K) or more, such as 1 W/(m·K) or more, or such as 1.2 W/(m·K) or more.

The automotive LED lamp heat sink according to one or more embodiments of the present invention is formed by injection molding, and the volume average particle size of graphite included in the heat sink may be, but not limited to, 1 to 500 μm, such as 10 to 300 μm, such as 20 to 200 μm, or such as 40 to 100 μm. If the volume average particle size is less than 1 μm, the thermal conductivity of the resin composition might decrease. As the particle size increases, the thermal conductivity and the molding processability thereof tend to increase. If the particle size exceeds 500 μm, however, strength of the resin composition might decrease. The volume average particle size can be measured by, for example, a laser diffraction method or a light-scattering method.

The particle size distribution is not specifically limited to a specific degree, but if the particle size distribution is limited, a ratio $D_{60}/D_{20}$ between particle sizes $D_{20}$ and $D_{80}$ in cases where accumulated volumes obtained by measuring particle size distribution are 20% and 80%, respectively, may be 1 to 20, such as 1 to 10, or such as 1 to 5.

In the thermally conductive resin composition according to one or more embodiments of the present invention, the volume average particle size of the flaked graphite before a melting and kneading process may be as large as possible, such as 1 to 700 μm, such as 10 to 650 μm, such as 40 to 500 μm, or such as 201 to 40 μm. The aspect ratio may be 21 or more. The upper limit of the aspect ratio may be as high as possible, and is not limited to a specific level. If the aspect ratio has an upper limit, the upper limit may be 3,000 or less, such as 1.000 or less, or such as 500 or less. In general, graphite tends to be crushed in a melting and kneading process or a molding process. Thus, as the volume average particle size of graphite before the melting and kneading process increases, the volume average particle size of the graphite after the melting and kneading process or the molding process is kept large, and the thermal conductivity and the molding processability increase.

The thermally conductive resin composition according to one or more embodiments of the present invention does not need to be used in the entire surface or the entire interior of the automotive LED lamp heat sink, and may be partially combined with a highly thermally conductive material such as a metal or a carbon material in order to enhance heat dissipation. The highly thermally conductive material is not limited to a specific location, and may be disposed on a heat-receiving surface of the heat sink, from the viewpoint of efficient heat dissipation in which heat from the LED module is dissipated by the highly thermally conductive material and then dissipated by the heat sink constituted by the thermally conductive resin.

That is, the automotive LED lamp heat sink according to one or more embodiments of the present invention includes, for example, a first configuration in which the heat sink is constituted only by a member of an injection molded product including a thermally conductive resin composition (hereinafter also referred to as a "thermally conductive resin member"), a second configuration in which the heat sink includes the thermally conductive resin member and a member of a highly thermally conductive material (hereinafter also referred to as a "highly thermally conductive member"), and a third configuration in which the heat sink includes the thermally conductive resin member, the highly thermally conductive member, and a thermally conductive layer of a thermal interface material. Each of the first through third configurations may include an insulating member of an insulating material. As the highly thermally conductive member, at least one material selected from the group consisting of a metal member and a carbon member.

The metal member is not limited to a specific material. Examples of the metal member include aluminum and an alloy including aluminum (aluminum alloy), copper and an alloy including copper (e.g., brass, bronze, aluminum brass), nickel, chromium, titanium, iron, cobalt, tin, zinc, palladium, silver, stainless, magnesium and an alloy including magnesium (magnesium alloy), and manganese. Among these metals, aluminum, copper, magnesium, and alloys of at least two of these metals may be used because these metals have thermal conductivities of 40 W/(m·K) or more and can be easily obtained. As a metal(s) constituting the metal member, the metals described above may be used singly or two or more of the metals may be used in combination.

Examples of the carbon material constituting the carbon member include a graphite sheet, and a carbon fiber mixed material, and the graphite sheet may be used because the graphite sheet has a high thermal conductivity. The in-plane thermal conductivity of the graphite sheet may not be limited to a specific value, and may be as high as possible. The graphite sheet may have a thermal conductivity of 500 W/(m·K) or more, such as 1,000 W/(m·K) or more, or such as 1,300 W/(m·K) or more.

The thickness of the highly thermally conductive member constituted by the highly thermally conductive metal and the carbon material is not limited to a specific value, and may be 5 mm or less, such as 3 mm or less, or such as 1 mm or less. Among the carbon materials, in the case of the graphite sheet, the thickness may be 500 μm or less, such as 200 μm or less, or such as 100 μm or less. The thickness may be as small as possible because a smaller thickness achieves a lighter weight.

The shape of the highly thermally conductive member of the highly thermally conductive material is not limited to a specific shape, and may be a flat-plate shape, a curved-plate shape, a rod shape, a cylindrical shape, or a massive shape, for example, and may be a combination of at least two of these shapes. The highly thermally conductive member may include a through hole, and/or a bent portion, for example.

In a case where the automotive LED lamp heat sink according to one or more embodiments of the present invention has the second or third configuration in which the thermally conductive resin member (hereinafter also referred to as a "resin molding part") and the highly thermally conductive member are united, the shape of a surface (heat receiving surface part) of the resin molding part according to one or more embodiments the present invention joined to the highly thermally conductive member is not limited to a specific shape and may be a flat-plate shape, a curved shape, an uneven shape, or a pointed shape, for example. In one or more embodiments of the present invention, from the viewpoints of further enhancing thermal conductivity and, accordingly, heat dissipation of the heat sink to be obtained, the thermally conductive resin member may be integrally joined and fixed to the highly thermally conductive member.

In a case where the highly thermally conductive member is a metal member, the surface of the metal member on which the resin molding parts are to be formed may be subjected to a surface treatment from the viewpoints of bonding strength and adhesion between the metal member and the resin molding part. Examples of the surface treatment include, but are not limited to, a fine roughening treatment using a special chemical solution or physical polishing, formation of coating using anodic oxidation and an organic compound, and primer coating using, for example, an adhesive. Examples of the metal surface treatment include metal surface treatment techniques described in JP 4527196 B and JP 5302315 B.

The resin molding part and the highly thermally conductive member are united by, for example, bonding fixture. Examples of a technique for the bonding fixture include insert molding, an adhesive, vibration welding, ultrasonic welding, and thermal welding. Among these techniques, bonding by insert molding, ultrasonic welding, thermal welding, and vibration welding may be used from the viewpoints of stable productivity and production at low costs, and ultrasonic welding, thermal welding, and vibration welding each of which bonds the highly thermally conductive member after molding of the heat sink may be used from the viewpoint of stable production of molding cycles.

The vibration welding may be performed at about 100 to 300 Hz, and the ultrasonic welding may be performed at 10 to 50 kHz. The total number of vibrations may be 300 to 10000 in the vibration welding, and 10000 to 150000 in the ultrasonic welding.

In the automotive LED lamp heat sink having the third configuration according to one or more embodiments of the present invention, a thermally conductive layer of a thermal interface material is interposed between the resin molding part and the highly thermally conductive member. The thermal interface material herein refers to a material used for filling a gap between two materials or bringing the materials into close contact with each other, and a material having a thermal conductivity. In combining resin molding parts constituting main portions of the heat sink and the highly thermally conductive metal member, the thermal interface material is used to fill a gap between the resin molding parts constituting the main portions of the heat sink and the highly thermally conductive metal member. The thermal interface material is not limited to a specific material, and may be a thermal interface material having a thermal conductivity of 0.5 W/(m·K) or more from the viewpoint of heat dissipation.

To provide an Insulating property, in the automotive LED lamp heat sink according to one or more embodiments of the present invention, an insulating member of at least a material selected from the group consisting of ceramic, an insulating resin, and an insulating resin composition may be partially combined, and from the viewpoint of providing an insulating property at low costs, the insulating resin and the insulating resin composition may be used. Examples of a method for the combining may include, but are not limited to, a method using integral molding such as insert molding and coinjection molding, and a method of separately forming only an insulating member and then combining the parts using an adhesive, vibration welding, ultrasonic welding, or thermal welding, for example.

Figure 1:
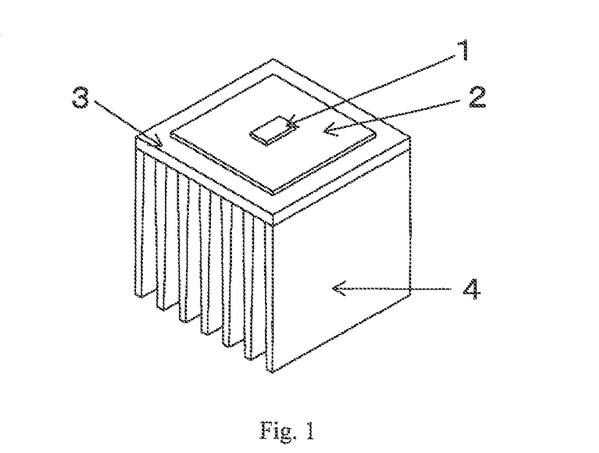
FIG. 1 is a perspective view illustrating a typical example of an automotive LED lamp heat sink according to one or more embodiments of the present invention.
Figure 2:
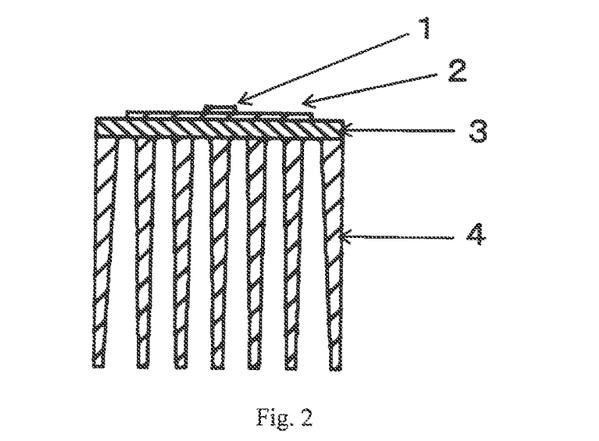
FIG. 2 is a cross-sectional view illustrating a typical example of the automotive LED lamp heat sink according to one or more embodiments of the present invention.

The shape of the automotive LED lamp heat sink according to one or more embodiments of the present invention is not limited to a specific shape, and a typical shape is illustrated in, for example, FIGS. 1 and 2. FIG. 1 is a perspective view, and FIG. 2 is a cross-sectional view. The automotive LED lamp heat sink illustrated in FIGS. 1 and 2 include a substantially square plate-shaped base 3 and a fin part 4 constituted by a plurality of fins. The fins are hung from a surface of the base 3 while being separated from one another, and the thickness of each of the fins decreases in a direction away from the base 3. An LED module 1 is disposed substantially at a center on another surface of the base 3 in the heat sink with a circuit board 2 interposed therebetween, and the LED module 1 and the circuit board 2 are connected to a power supply (not shown), thereby forming an LED lamp for vehicles. The planar shape of the base 3 is not limited to a square, and may be any shape such as a rectangle, a circle, an oval, a triangle, a pentagon, or other polygons having six or more vertexes.

That is, the LED lamp for vehicles illustrated in FIGS. 1 and 2 has the stacked configuration of the LED module 1, the base 3 of the heat sink, and the fin part 4 of the heat sink, and an increase of a thru-plane thermal conductivity of the base 3 of the heat sink enables heat of the LED module 1 to be efficiently transferred to the fin part 4 to enhance heat dissipation. Thus, the heat sink may be designed to have the shapes described below. It may be possible to cause a melted material of a thermally conductive resin composition to flow into a die cavity for injection molding of the heat sink through a gate that is narrow relative to the thickness of the heat sink, that is, design the heat sink under a condition that a thickness ratio of the heat sink to the gate in the die (i.e., a ratio of heat sink thickness/gate thickness) is two or more, such as three or more, or such as five or more. The gate thickness here includes a gate diameter. The thickness of the heat sink here refers to a thickness of a part except the fin part, is not limited to a specific thickness, and may be a thickness of the base 3. Since the ratio of heat sink thickness/gate thickness is two or more, the flaked graphite (B) and other thermally conductive fillers can be oriented in the thickness direction of the molded article (resin molding part) so that the thru-plane thermal conductivity of the heat sink can be efficiently enhanced.

Examples of the type of the gate include, but are not limited to, a direct gate, a side gate, a pinpoint gate, a film gate, a disc gate, a ring gate, a fan gate, a tab gate, a submarine gate, and a hot runner gate. From the viewpoint of easily orienting the fillers in the thickness direction of the molded body, the pinpoint gate and the film gate may be used.

The gate may be disposed at any location, and may be disposed at a location except a region where the fin part 4 is to be molded in the die, from the viewpoints of heat dissipation and formability.

The number of gate ports is not limited to a specific number, and may be two or more from the viewpoints of heat dissipation and formability. In a case where the number of gates is two or more, a thru-plane thermal conductivity of a welded part occurring at filling with a resin can be increased so that heat of the LED module can be efficiently transferred to the fins. In the case where two or more gates are disposed, the gates may be symmetric with respect to the heat sink as much as possible from the viewpoint of formability.

The automotive LED lamp heat sink is not limited to a specific size. Power consumption of an LED differs among applications of a lamp to be used, and the size of the heat sink necessary for heat dissipation also varies. The length of a longest side of the heat sink for a rear lamp may be 100 mm or less, such as 70 mm or less, such as 50 mm or less, or such as 40 mm or less. The length of a longest side of the heat sink for a front lamp may be 200 mm or less, such as 120 mm or less, such as 80 mm or less, or such as 50 mm or less. The length of a longest side of the heat sink for a head lamp may be 300 mm or less, such as 200 mm or less, such as 100 mm or less, or such as 80 mm or less.

As the heat sink size decreases, the weight of the heat sink can be reduced, but heat dissipation required in the heat sink increases, leading to a requirement for flexibility in shape. For this reason, the thermoplastic resin composition (thermally conductive resin composition) according to one or more embodiments of the present invention may have excellent formability and may be used for a rear lamp having a small heat sink size.

The thickness of the base 3 of the heat sink may not be limited to a specific thickness, and may be 10 mm or less, such as 5 mm or less, such as 3 mm or less, or such as 2 mm or less. If the thickness exceeds 10 mm, heat of the LED module cannot be efficiently transferred to the fins of the heat sink in some cases. The fin part 4 of the heat sink is not limited to a specific height, and may be as high as possible from the viewpoint of enhancing heat dissipation. In this case, the in-plane thermal conductivity of the fin part 4 may be higher than the in-plane thermal conductivity of the base as much as possible. To achieve the higher in-plane thermal conductivity of the fin part 4, a ratio of the thickness of the fin part 4 of the heat sink with respect to the thickness of the base 3 of the heat sink (fin thickness/base thickness) may be one or less. If the thicknesses of the fins are not uniform, the thickness ratio is calculated as a thickness of a root of each fin.

Figure 3:
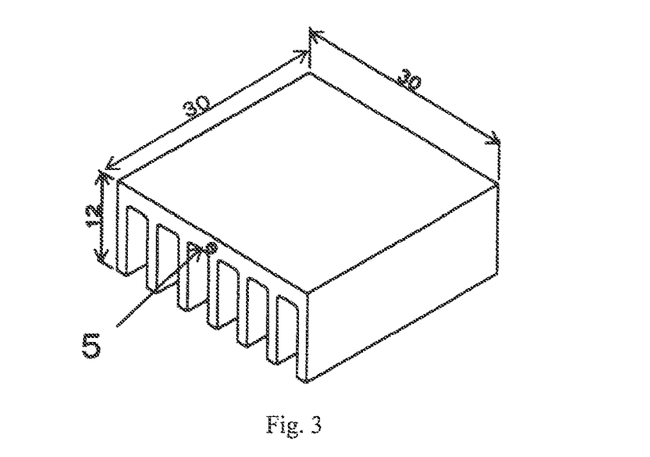
FIG. 3 is a perspective view illustrating another typical example of the automotive LED lamp heat sink according to one or more embodiments of the present invention.
Figure 4:
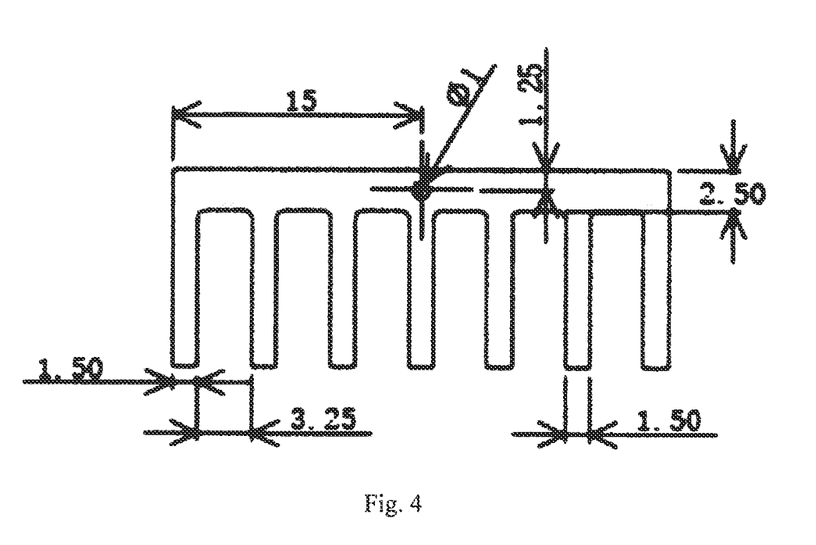
FIG. 4 is a cross-sectional view illustrating another typical example of the automotive LED lamp heat sink according to one or more embodiments of the present invention.
Figure 5:
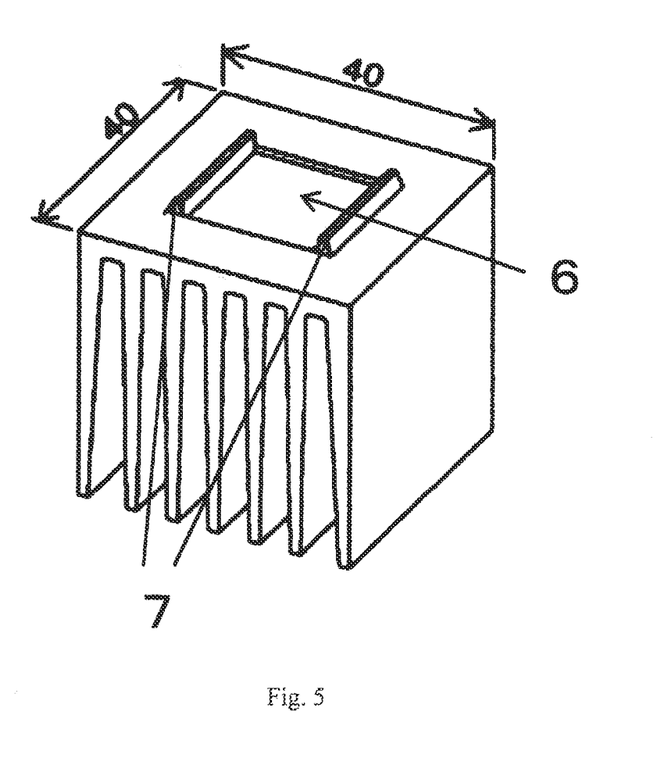
FIG. 5 is a perspective view illustrating yet another typical example of the automotive LED lamp heat sink according to one or more embodiments of the present invention.
Figure 6:
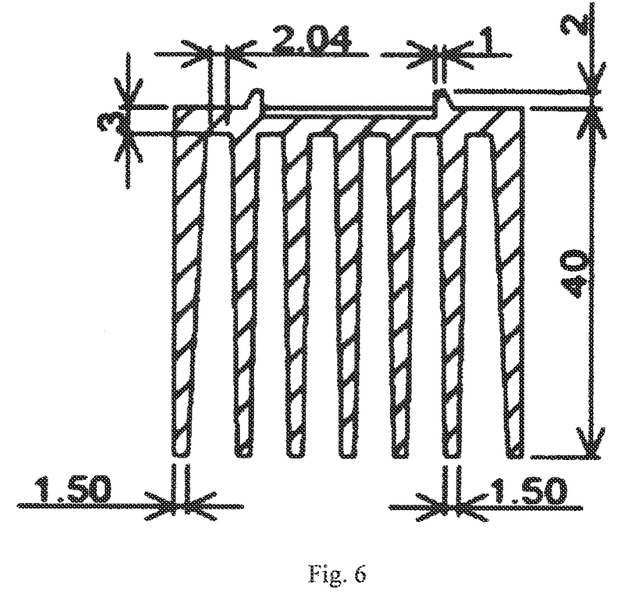
FIG. 6 is a cross-sectional view illustrating still another typical example of the automotive LED lamp heat sink according to one or more embodiments of the present invention.
Figure 7:
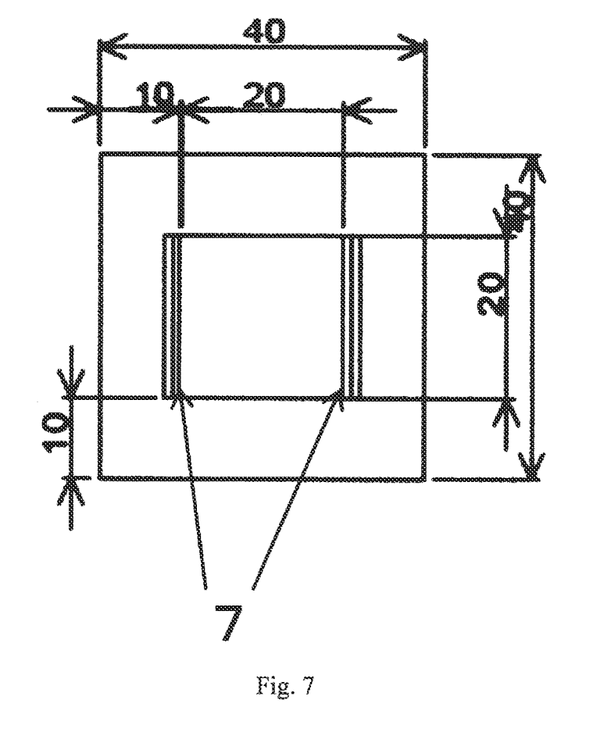
FIG. 7 is a top view illustrating another typical example of the automotive LED lamp heat sink according to one or more embodiments of the present invention.
Figure 8:
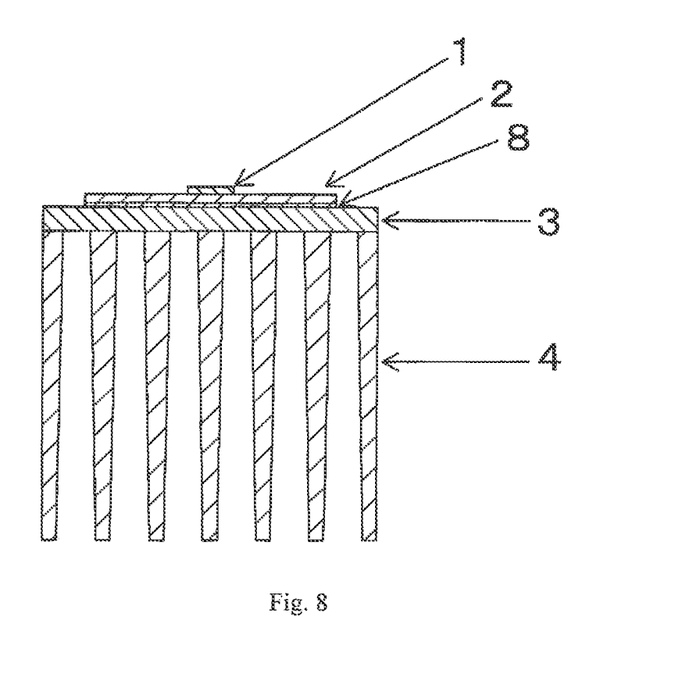
FIG. 8 is a cross-sectional view illustrating another typical example of the automotive LED lamp heat sink according to one or more embodiments of the present invention.

The thermally conductive resin member illustrated in FIGS. 3 and 4 includes a gate mark 5. The gate mark 5 is formed by disposing a gate in a region where an end face of the base in the die is to be formed. The thermally conductive resin member illustrated in FIG. 5 to 7 includes, on a surface opposite to the surface of the base on which the fin part is provided, a recess 6 having a spatial shape in conformity with the shapes of the circuit board and the thermal conductive member, and ribs 7 standing on both ends of the recess 6 in one direction and serving as projections for fixing the circuit board and the thermal conductive member, in the thermally conductive resin member illustrated in FIGS. 1 and 2. For example, the circuit board and the thermal conductive member are placed on the recess 6 and then the ribs 7 are swaged, thereby ensuring fixing of the circuit board and the thermal conductive member. In the LED module illustrated in FIG. 8, a highly thermally conductive metal member 8 is disposed between the circuit board 2 and the base 3 in the LED module illustrated in FIGS. 1 and 2.

The automotive LED lamp heat sink according to one or more embodiments of the present invention has high heat resistance, and a heat distortion temperature (HDT) of 120° C., such as 130° C. or more, or such as 150° C. or more, under a load of 1.82 MPa. As the luminance of the LED increases, the temperature of the LED itself tends to increase, and the HDT may be 120° C. or more.

The automotive LED lamp heat sink according to one or more embodiments of the present invention has high long-term heat resistance. The automotive LED lamp heat sink can be used for a long period at high temperatures in some cases, and thus, the long-term heat resistance may be as high as possible. The long-term heat resistance here refers to a retention rate of bending strength(bending strength after exposure for 2000 hours/initial bending strength) in a case where the heat sink is left in the air in a 150° C. atmosphere for 2000 hours, may be 60% or more, such as 70% or more, or such as 75% or more.

The automotive LED lamp heat sink according to one or more embodiments of the present invention has high emissivity. The emissivity herein is obtained by measuring an emissivity of a molded body with an emissivity detector, and may be 0.65 or more, such as 0.7 or more, or such as 0.75 or more.

The automotive LED lamp heat sink according to one or more embodiments of the present invention also shows excellent electromagnetic shielding, and the electromagnetic shielding effect at a frequency of 100 MHz may be 5 dB or more, such as 10 dB or more, or such as 15 to 60 dB.

Next, optional components except the thermoplastic polyester resin (A) and the flaked graphite (B) in the thermally conductive resin composition used in one or more embodiments of the present invention will be described. The optional components are, for example, one or more component selected from, for example, thermally conductive fillers except the flaked graphite (B), filling agents except the flaked graphite (B) and other thermally conductive filler, synthetic resins except the thermoplastic polyester resin (A), resin additives such as reinforcing agents, thermal stabilizers, antioxidants, ultraviolet absorbers, antioxidants, thickeners, release agents, plasticizers, coupling agents, flame retardants, fire resistant agents, coloring agents, and other agents. These optional components may be used without impairing properties of the thermally conductive resin composition used in one or more embodiments of the present invention. The optional components will be more specifically described.

In addition to the flaked graphite (B) used in one or more embodiments of the present invention, other thermally conductive fillers may be used in combination. The shape of the filler is not limited to a specific shape, and may be various shapes such as a flaked shape, a fiber shape, a flake shape, a plate shape, a sphere shape, a particle shape, a fine particle shape, a nanoparticle shape, an agglomerated particle shape, a tube shape, a nanotube shape, a wire shape, a rod shape, an indefinite shape, a rugby ball shape, a hexahedral shape, a complex particle shape in which large particles and fine particles are mixed, and a liquid shape. Specific examples of the filler include metal fillers such as aluminum and nickel, low-melting point alloys having a liquidus temperature of 300° C. or more and a solidus temperature of 150° C. or more and 250° C. or less, metal oxides such as aluminum oxide, magnesium oxide, silicon oxide, beryllium oxide, copper oxide, and cuprous oxide, metal nitrides such as aluminum nitride and silicon nitride, metal carbides such as silicon carbide, metal carbonates such as magnesium carbonate, insulating carbon materials such as diamond, metal hydroxides such as aluminum hydroxide and magnesium hydroxide, alumina, boron nitride, glass fibers, carbon fibers, potassium titanate whisker, silicon nitride fibers, carbon nanotubes, talc, and wollastonite. The additive amount of the thermally conductive filler is not limited to a specific amount. As the additive amount increases, thermal conductivity can be enhanced. The inorganic filler may be a natural product or a synthetic product. In the case where the inorganic filler is a natural product, a production region, for example, is not specifically limited, and any appropriate natural product can be selected.

In addition to the thermally conductive filler described above, a wide variety of known filling agents can be used as the resin composition according to one or more embodiments of the present invention. Examples of the filling agent except the thermally conductive filler include diatomite powder, basic magnesium silicate, baked day, micronized silica, quartz powder, crystalline silica, kaolin, antimony trioxide, micronized mica, molybdenum disulfide, inorganic fibers such as rock wool, ceramic fibers, and asbestos, and glass filling agents such as glass fibers, glass powder, glass cloth, and molten silica. Use of such a filling agent enables enhancement of properties, such as thermal conductivity, mechanical strength, or abrasion resistance, for an application of the resin composition. Moreover, organic filling agents exemplified by paper, pulp, wood, synthetic fibers such as polyamide fibers, aramid fibers, and boron fibers, and resin powder such as polyolefin powder may be blended in combination, as necessary.

The filler used in one or more embodiments of the present invention may be subjected to a surface treatment with various surface treatment agents such as a silane treatment agent, stearic acid, and acrylic monomers, in order to enhance adhesion at the interface between the resin and the filler and facilitate processability. The surface treatment agent is not limited to a specific type, and known agents such as a silane coupling agent or a titanate coupling agent can be used, for example. A silane coupling agent containing an epoxy group such as epoxysilane, a silane coupling agent containing an amino group such as aminosilane, and polyoxyethylene silane may be used because these silane coupling agents are less likely to, for example, reduce a physical property of the resin. The surface treatment method of the filler is not limited to a specific method, and a general surface treatment method can be used.

The thermally conductive resin composition according to one or more embodiments of the present invention may be alloyed with any known resin such as an epoxy resin, a polyolefin resin, a bismaleimide resin, a polyimide resin, a polyether resin, a phenol resin, a silicone resin, a polycarbonate resin, a polyamide resin, a polyester resin, a fluorocarbon resin, an acrylic resin, a melamine resin, an urea resin, and an urethane resin.

The thermally conductive resin composition according to one or more embodiments of the present invention may be supplemented with, as an additive except the resin and the filler, a reinforcing agent, a thermal stabilizer, an antioxidant, an ultraviolet absorber, an antioxidant thickener, a mold release agent, a plasticizer, a coupling agent, a flame retardant, a fire resistant agent, a coloring agent, and other agents, for example, for any purpose as required. Such an additive may be used in the range from 0 to 20 parts by weight in total with respect to 100 parts by weight of the thermoplastic resin. Examples of the thermal stabilizer include phosphites, hindered phenols, and thioethers. These materials may be used singly or two or more of them may be used in combination.

Examples of the antioxidant include phosphites, hindered amines, hydroquinones, hindered phenols, and sulfur-containing compounds. These materials may be used singly or two or more of them may be used in combination.

Examples of the ultraviolet absorber include benzophenones, benzotriazoles, salicylates, and metal complex salts. These materials may be used singly or two or more of them may be used in combination.

Examples of the flame retardant include an organic flame retardant, an inorganic flame retardant, and a reaction system flame retardant. These materials may be used singly or two or more of them may be used in combination.

Examples of the organic flame retardant include halogen-based flame retardants such as a brominated epoxy-based compound, a brominated alkyl triazine compound, a brominated bisphenol-based epoxy resin, a brominated bisphenol-based phenoxy resin, a brominated bisphenol-based polycarbonate resin, a brominated polystyrene resin, a brominated crosslinked polystyrene resin, a brominated bisphenol cyanurate resin, a brominated polyphenylene ether, brominated bismaleimide, decabromodiphenyl oxide, tetrabromobisphenol A and its oligomer; phosphorus-based flame retardants including phosphates such as trimethyl phosphate, triethyl phosphate, tripropyl phosphate, tributyl phosphate, tripentyl phosphate, trihexyl phosphate, tricyclohexyl phosphate, triphenyl phosphate, tricresyl phosphate, trixylenyl phosphate, cresyl diphenyl phosphate, dicresyl phenyl phosphate, dimethylethyl phosphate, methyl dibutyl phosphate, ethyl dipropyl phosphate, and hydroxyphenyl diphenyl phosphate, compounds obtained by modifying these phosphates with substituents, condensed phosphate compounds, and phosphazene derivatives containing a phosphorus element and a nitrogen element, and polytetrafluoroethylene. These materials may be used singly or two or more of them may be used in combination.

Examples of the inorganic flame retardant include aluminum hydroxide, antimony oxide, magnesium hydroxide, zinc borate, a zirconium-based compound, a molybdenum-based compound, zinc stannate, guanidine salt, a silicone-based compound, and a phosphazene-based compound. These materials may be used singly or two or more of them may be used in combination.

Examples of the reaction system flame retardant include tetrabromobisphenol A, dibromophenol glycidyl ether, brominated aromatic triazine, tribromophenol, tetrabromophthalate, tetrachlorophthalic anhydride, dibromoneopentyl glycol, poly(pentabromobenzyl polyacrylate), chlorendic acid (HET acid), chlorendic anhydride (HET acid anhydride), brominated phenol glycidyl ether, dibromocresyl glycidyl ether, and organic phosphorous-based flame retardant represented by General Formula (3) below (where $n$ is an integer of 2 to 20). These materials may be used singly or two or more of them may be used in combination.

In a case where the composition according to one or more embodiments of the present invention includes a flame retardant, a flame retardant agent may be used. Examples of the flame retardant agent include antimony compounds such as diantimony trioxide, diantimony tetraoxide, diantimony pentoxide, antimony sodiate, and antimony tartrate, zinc borate, barium metaborate, hydrated alumina, zirconium oxide, ammonium polyphosphate, tin oxide, and iron oxide. These materials may be used singly or two or more of them may be used in combination. To enhance flame resistance, silicone oil may be blended.

General Formula 3

Examples of the antioxidant include a naphthylamine-based compound, a diphenylamine-based compound, a p-phenylenediamine-based compound, a quinoline-based compound, a hydrochinone derivative-based compound, a monophenol-based compound, a bisphenol-based compound, a trisphenol-based compound, a polyphenol-based compound, a thiobisphenol-based compound, a hindered phenol-based compound, a phosphite-based compound, an imidazole-based compound, a dithiocarbamic acid nickel salt-based compound, and a phosphorus-based compound. These materials may be used singly or two or more of them may be used in combination.

Examples of the plasticizer include phthalates such as dimethyl phthalate, diethyl phthalate, dibutyl phthalate, di-isobutyl phthalate, dioctyl phthalate, butyl octyl phthalate, di-(2-ethylhexyl)phthalate, di-iso-octyl phthalate, and di-isodecyl phthalate; fatty acid esters such as dimethyl adipate, di-isobutyl adipate, di-(2-ethylhexyl)adipate, di-iso-octyl adipate, di-isodecyl adipate, octyl decyl adipate, di-(2-ethylhexyl)azelate, di-iso-octyl azelate, di-isobutyl azelate, dibutyl sebacate, di-(2-ethylhexyl)sebacate, and di-iso-octyl sebacate; trimellitic acid esters such as trimellitic acid isodecyl ester, trimellitic acid octyl ester, trimellitic acid n-octyl ester, and trimellitic acid isononyl ester; di-(2-ethylhexyl)fumarate, diethylene glycol monooleate, glyceryl monoricinoleate, trilauryl phosphate, tristearyl phosphate, tri-(2-ethylhexyl) phosphate, epoxidized soybean oil, and polyether ester. These materials may be used singly or two or more of them may be used in combination.

Examples of the antibacterial agent include: inorganic antibacterial agents exemplified by zeolite-based antibacterial agents such as silver-based zeolite and silver-zinc-based zeolite, silica gel-based antibacterial agents such as silver complex-silica gel, glass-based antibacterial agents, calcium phosphate-based antibacterial agents, zirconium phosphate-based antibacterial agents, silicate-based antibacterial agents such as silver-magnesium aluminosilicate, titanium oxide-based antibacterial agents, ceramic-based antibacterial agents, and whisker-based antibacterial agents; organic antibacterial agents exemplified by formaldehyde releasing agents, halogenated aromatic compounds, load propargyl derivatives, thiocyanato compounds, isothiazolinone derivatives, trihalomethylthio compounds, quaternary ammonium salts, biguanide compounds, aldehydes, phenols, pyridine oxide, carbanilide, diphenyl ether, carboxylic acids, and organic metal compounds; inorganic-organic hybrid antibacterial agents; and natural antibacterial agents. These materials may be used singly or two or more of them may be used in combination.

Examples of the coloring agent include organic dies, inorganic pigments, and organic pigments. These materials may be used singly or two or more of them may be used in combination.

The method for producing the thermoplastic resin composition (thermally conductive resin composition) according to one or more embodiments of the present invention is not limited to a specific method. For example, after the components and additives described above, for example, have been dried, the dried materials are melted and kneaded with a melting and kneading machine such as a single-screw or two-screw extruder, thereby obtaining a melting and kneading product. The kneading temperature is selected depending on the type of the thermoplastic polyester resin (A). In a case where an ingredient is liquid, this ingredient may be added to the melting and kneading machine in the middle of the process by using a liquid supply pump, for example.

EXAMPLES

The thermally conductive resin composition according to one or more embodiments of the present invention will be described in further detail with reference to production examples, examples, and comparative examples, but the present invention is not limited to these examples.

Materials for use in preparing the resin composition are as follows.

Thermoplastic Polyester Resin (A)

polyethylene terephthalate (A-1): Novapex PBK II (trade name), manufactured by Mitsubishi Chemical Corporation and having a number average molecular weight of 28,000 polyethylene terephthalate (A-2): GS-100 (trade name), manufactured by Mitsubishi Chemical Corporation and having a number average molecular weight of 22,500 polyethylene terephtalate (A-3): KS710B-8S (trade name), manufactured by Kuraray Co., Ltd. and having a number average molecular weight of 61,000 polyester-polyether copolymer (A-4):

As the polyester-polyether copolymer (A-4), a copolymer produced by the following method was used.

That is, a reactor equipped with an agitator and a gas discharge outlet was loaded with 70 parts by weight of polyethylene terephthalate (PET) (where IV=0.65) produced with an antimony-based catalyst and having an antimony metal concentration of 200 ppm by weight, 30 parts by weight of polyether that is Bisol 18EN described later, antimony trioxide in 160 ppm with respect to the total amount of PET and polyether, and 0.2 parts by weight of an antioxidant (Irganox 1010 manufactured by Chiba Specialty Chemicals Inc.), then was held at 270° C. for two hours, was subjected to reduced pressure with a vacuum pump, and held for three hours at one torr, and thereafter, the resulting product was taken out, thereby obtaining a polyester-polyether copolymer (A-4). The obtained polyester-polyether copolymer (A-4) had a number average molecular weight of 25,400.

In Bisol 18EN described above, the number average of (m+n) in the structure represented by General Formula (2) was 18.

Thermoplastic polyamide resin: nylon 6, A1020BRL (trade name) manufactured by Unitika Ltd.

Flaked Graphite (B)

Flaked graphite (B-1): CPB-80 (trade name), manufactured by Chuetsu Graphite Works Co., Ltd. and having a volume average particle size of 300 μm, a fixed carbon content of 99.9%, and an aspect ratio of 100

Flaked graphite (B-2): BF-40AK (trade name), manufactured by Chuetsu Graphite Works Co., Ltd. and having a volume average particle size of 50 μm, a fixed carbon content of 99.9%, and an aspect ratio of 30

Flaked graphite (B-3): MD-100C (trade name), manufactured by Chuetsu Graphite Works Co., Ltd. and having a volume average particle size of 170 μm, a fixed carbon content of 93.6%, and an aspect ratio of 80

Reinforcing Agent (C)

glass fibers: T187H/PL (trade name), manufactured by Nippon Electric Glass Co., Ltd. and having a thermal conductivity of 1.0 W/(m·K) when measured alone, a fiber diameter of 13 μm, and a number average fiber length of 3.0 mm.

Evaluation Method

Molding process conditions: A molding process temperature of a molded article for use in evaluation differs among thermoplastic resins to be used, and injection molding was performed at molding process temperatures indicated in Table 1. Molding was performed with a fixed injection speed of 150 mm/s under a fixed injection pressure of 150 MPa.

Volume average particle size of graphite: Graphite particles were placed in a water medium and subjected to ultrasonic vibrations for 60 seconds, and then measurements were performed with a microtrac particle size distribution analyzer (MICROTRAC MT3300EXII manufactured by Nikkiso Co., Ltd.). To measure a volume average particle size of graphite particles after a molding process, using pellets of the obtained thermally conductive resin composition, a heat sink (gate diameter. φ1 mm) illustrated in FIGS. 3 and 4 was produced with an injection molding machine (Si-301V manufactured by Toyo Machinery & Metal Co., Ltd.), and baked at 620° C. for one hour, and then only graphite particles included in the heat sink were taken out for measurements.

Aspect ratio of graphite: A maximum diameter in in-planer direction and a minimum thickness of each of 100 graphite particles were measured with a scanning electron microscope (SEM) (JSM-6060LA manufactured by JEOL Ltd.), and an aspect ratio of graphite particles was calculated using average values of the measured values. An aspect ratio of graphite particles after the molding process was calculated in the same manner by using the heat sink illustrated in FIGS. 3 and 4.

Number average molecular weight: A part of the heat sink illustrated in FIGS. 3 and 4 produced by injection molding was dissolved in a mixed solvent of p-chlorophenol (manufactured by Tokyo Chemical Industry Co., Ltd.) and toluene whose volume ratio is 3:8 to adjust the concentration thereof to 0.25 weight %, and then only a thermoplastic resin was extracted, thereby preparing a sample. Using standard polystyrene, and a similar sample solution was prepared. Measurements were performed with a high-temperature GPC (manufactured by Viscotek: 350 HT-GPC System) at a column temperature of 80° C. and a flow rate of 1.00 mL/min. A differential refractometer (RI) was used as a detector.

Extrusion and kneading temperature: The thermally conductive resin composition was produced by an extrusion, melting, and kneading process. The extrusion and kneading temperature in this process differs among the thermoplastic polyester resins (A), and an extrusion and kneading process was performed at an extrusion barrel temperature indicated in Table 1.

Thermal conductivity; Using pellets of the obtained thermally conductive resin composition, a molded article of φ 26 mm×1 mm thickness was prepared with an injection molding machine (Si-151V manufactured by Toyo Machinery & Metal Co., Ltd.), and in-plane and thru-plane thermal conductivities in the air at room temperature were measured in conformity with the ASTM E1461 standard by using a laser flash thermal conductivity analyzer (LFA447 manufactured by NETZSCH).

Thermal conductivity of heat sink: Two types of heat sinks (1) and (2) having the same shape and dimensions as illustrated in FIGS. 3 and 4 except for a cross sectional shape of a gate mark 5 were produced by injection molding. A thru-plane thermal conductivity of a base 3 of each of the obtained heat sinks was measured.

cross sectional shape of the gate mark 5 of the heat sink (1): substantially a circle of φ 1 mm cross sectional shape of the gate mark 5 of the heat sink (2): substantially a square of 2 mm×2 mm Specific gravity: Using a molded body of (p 26 mm×1 mm thickness, the specific gravity was measured by an underwater substitution method in conformity with the ISO1183 standard.

Molding processability: With an injection molding machine (Si-301V manufactured by Toyo Machinery & Metal Co., Ltd.) whose molding temperature and mold temperature are adjusted to those shown in Table 1, dependent on the type of thermoplastic resin included in thermally conductive resin compositions, flow lengths of pellets of the obtained thermally conductive resin composition were measured by a spiral molded article (10 mm wide×1 mm thick, with a pitch of 5 mm) at an injection pressure of 150 MPa and an injection speed of 150 mm/s, to determine moldability as follows: ○ (circle) shows a result that the flow length is 120 mm or more, a (triangle) shows a result that the flow length is 80 to 120 mm, and x (cross) shows a result that the flow length is less than 80 mm.

Heat resistance: HDT (high load): A test piece with dimensions of 80 mm×40 mm×4 mm thickness was prepared with an injection molding machine (Si-301V manufactured by Toyo Machinery & Metal Co., Ltd.), and measurements were performed in conformity with the ISO75 standard.

Long-term heat resistance: A test piece was left in the air in a 150° C. atmosphere for 2000 hours in a small-size high-temperature chamber (ST-120 manufactured by ESPEC Corp.). Bending strengths of the test piece before and after the test were measured in conformity with ISO178, and a retention rate of bending strength (bending strength after 2000 hours/initial bending strength) was calculated.

Emissivity: Using an emissivity detector (TSS-5X manufactured by Japan Sensor Corporation), an emissivity of a molded article with dimensions of 80 mm×40 mm×4 mm thickness was measured.

Fogging property: A sample of φ 26 mm×1 mm thickness produced by injection molding was left in the atmosphere of 23° C. and 50% humidity for one week, and then three samples were placed in a glass tube (having an outer diameter of 80 mm×a height of 180 mm with an opening outer diameter of 60 mm), a glass plate is mounted on the opening of the glass tube, and a gap between the glass tube and the glass plate was sealed with a plastic wrap. This glass tube was immersed in an oil bath at 120° C. for 24 hours, and a gas generated during this immersion was caused to be attached to the glass plate. Thereafter, a haze value (fogging) of the glass plate was measured with a turbidimeter (NDH-300A manufactured by Nippon Denshoku Industries Co., Ltd.), and anti-fogging properties was determined as follows: ○ (circle) shows a result that the haze value is less than 5%, Δ (triangle) shows a result that the haze value is 5 to 10%, and x (cross) shows a result that the haze value is 10% or more. As the haze value decreases, fogging is reduced, that is, anti-fogging properties are excellent. As the haze value increases, glass is fogged to a greater degree, and anti-fogging properties degrade.

Ultrasonic weldability: A heat sink (40×40×40 mm) in a shape illustrated in FIG. 5 to 7 was produced, and an aluminum plate (20×20, thickness of 1 mm) was placed on an upper surface of the heat sink. Using an ultrasonic welding machine (2000×dt manufactured by Emerson Electric Co.), ribs 7 were welded for three seconds with an ultrasonic vibrations at 20 kHz with an amplitude set value of 80%, to determine ultrasonic weldability as follows: ○ (circle) shows a result that burr does not occur in a welded portion, and x (cross) shows a result that burr occurs in the welded portion, and when burr was scraped with a nail, chippings occur.

TABLE 1

| Thermoplastic resin | Extrusion, melting, and kneading process Barrel temperature (° C.) | Molding process | |
|---|---|---|---|
| | | Cylinder temperature (° C.) | Mold temperature (° C.) |
| A-1 | 280 | 280 | 120 |
| A-2 | 280 | 280 | 120 |
| A-3 | 280 | 280 | 80 |
| Co-use of A-1 and A-4 | 280 | 280 | 100 |
| A-5 | 260 | 260 | 100 |

Examples 1 to 8

The thermoplastic polyester resins (A-1) to (A-4) are dried at 140° C. for 4 hours with a hot air dryer. Samples were prepared by mixing with weight ratio shown in Table 2. To the samples, 0.3 parts by weight of each of a phenol-based stabilizer (AO-60 manufactured by ADEKA Corporation) and a phosphorus-based antioxidant (ADK STAB PEP-36 manufactured by ADEKA Corporation) was added with respect to 100 parts by weight of the resin composition. This mixture was melted and kneaded using a 25-mm co-rotating complete intermeshing twin-screw extruder MFU25TW-60HG-NH-1300 manufactured by Technovel Corporation, with an output of 20 kg/h at a screw revolution of 150 rpm and an extrusion barrel temperature indicated in Table 1, thereby obtaining pellets of the resin composition.

Using the obtained pellets of the resin composition, molded articles were prepared and evaluated. Table 2 shows the volume average particle size and aspect ratio of graphite particles included in the heat sink and physical property.

Comparative Example 1

Components are the same as those of Example 1 except that the composition was changed as shown in Table 3. Table 3 shows the volume average particle size and aspect ratio of graphite particles included in the heat sink, and physical property.

Comparative Example 2

A sample was prepared by changing the thermoplastic polyester resin to a thermoplastic polyamide resin, drying the resin with a hot air dryer at 120° C. for six hours, and mixing the resin at a weight ratio shown in Table 3. The sample was treated in the same manner as that of Example 1 except that the extrusion barrel temperature and the injection molding conditions were changed. Table 3 shows the volume average particle size and aspect ratio of graphite particles included in the heat sink, and physical property.

TABLE 3

|  |  |  | Comparative Example 1 | Comparative Example 2 |
|---|---|---|---|---|
| Polyester resin | A-1 | weight % | 60 |  |
|  | A-2 |  |  |  |
|  | A-3 |  |  |  |
|  | A-4 |  |  |  |
| Polyamide resin |  |  |  | 50 |
| Graphite | B-1 |  |  | 45 |
|  | B-2 |  |  |  |
|  | B-3 |  | 40 |  |
| Glass fibers | C |  |  | 5 |
| Specific gravity |  |  | 1.6 | 1.5 |
| Number-average molecular weight |  |  | 21,300 | — |
| Volume-average particle size of graphite particles included in heat sink |  | μm | 51 | 74 |
| Aspect ratio of graphite particles included in heat sink |  |  | 200 | 350 |
| Fixed carbon content |  | % | 93.6 | 99.9 |
| In-plane thermal conductivity |  | W/(m·K) | 9.8 | 12.1 |
| Thru-plane thermal conductivity |  |  | 0.9 | 1.0 |
| Heat Sink 1 base thru-plane thermal conductivity |  |  | 1.2 | 1.4 |
| Heat Sink 2 base thru-plane thermal conductivity |  |  |  |  |

TABLE 2

|  |  |  | Examples |  |  |  |  |  |  |  |
|---|---|---|---|---|---|---|---|---|---|---|
|  |  |  | 1 | 2 | 3 | 4 | 5 | 6 | 7 | 8 |
| Polyester resin | A-1 | weight % | 70 | 65 | 60 |  | 40 |  | 60 | 60 |
|  | A-2 |  |  |  |  |  |  | 40 |  |  |
|  | A-3 |  |  |  |  | 50 |  |  |  |  |
|  | A-4 |  |  |  |  | 10 | 10 | 10 |  |  |
| Polyamide resin |  |  |  |  |  |  |  |  |  |  |
| Graphite | B-1 |  | 30 | 30 | 40 | 40 | 45 | 45 |  | 40 |
|  | B-2 |  |  |  |  |  |  |  | 40 |  |
|  | B-3 |  |  |  |  |  |  |  |  |  |
| Glass fibers | C |  |  | 5 |  |  | 5 | 5 |  |  |
| Specific gravity |  |  | 1.5 | 1.6 | 1.6 | 1.6 | 1.7 | 1.7 | 1.6 | 1.6 |
| Number-average molecular weight |  |  | 22,400 | 22,100 | 21,600 | 29,200 | 19,800 | 18,700 | 21,200 | 21,100 |
| Volume-average particle size of graphite particles included in heat sink | μm |  | 75 | 73 | 74 | 66 | 65 | 67 | 36 | 73 |
| Aspect ratio of graphite particles included in heat sink |  |  | 250 | 350 | 400 | 300 | 400 | 300 | 250 | 400 |
| Fixed carbon content | % |  | 99.9 | 99.9 | 99.9 | 99.9 | 99.9 | 99.9 | 99.9 | 99.9 |
| In-plane thermal conductivity |  |  | 6.5 | 7.2 | 12.1 | 11.8 | 14.8 | 14.5 | 10.6 | 12.1 |
| Thru-plane thermal conductivity |  |  | 0.9 | 1.1 | 1.1 | 1.2 | 1.5 | 1.5 | 1.0 | 1.1 |
| Heat Sink 1 base thru-plane thermal conductivity | W/(m·K) |  | 1.3 | 1.4 | 1.5 | 1.5 | 1.9 | 1.9 | 1.2 |  |
| Heat Sink 2 base thru-plane thermal conductivity |  |  |  |  |  |  |  |  |  | 1.2 |
| Molding processability |  |  | ◯ | ◯ | ◯ | ◯ | ◯ | ◯ | Δ | ◯ |
| HDT | ° C. |  | 153 | 218 | 206 | 198 | 214 | 211 | 204 | 206 |
| Long-term heat resistance (retension rate of bending strength) | % |  | 77 | 81 | 79 | 80 | 81 | 82 | 78 | 78 |
| Emissivity |  |  | 0.82 | 0.81 | 0.80 | 0.79 | 0.78 | 0.77 | 0.79 | 0.80 |
| Anti-fogging properties |  |  | ◯ | ◯ | ◯ | ◯ | ◯ | ◯ | ◯ | ◯ |
| Ultrasonic weldability |  |  | ◯ | ◯ | ◯ | ◯ | ◯ | ◯ | ◯ | ◯ |

TABLE 3-continued

|  | Comparative Example | |
| --- | --- | --- |
|  | 1 | 2 |
| Molding processability | x | ○ |
| HDT °C. | 202 | 199 |
| Long-term heat resistance (retention rate of bending strength) % | 78 | 83 |
| Emissivity | 0.80 | 0.79 |
| Anti-fogging properties | ○ | x |
| Ultrasonic weldability | ○ | x |

Results of Example 3 and Comparative Example 1 show that with the same amount of graphite, a graphite fixed carbon content of 98% or more in the Examples gave high thermal conductivities and high molding processabilities. A comparison between the Examples and Comparative Example 2, the thermally conductive resin compositions of the Examples are superior in anti-fogging properties and ultrasonic welding. Example 3 and Example 7 demonstrate that as the volume average particle size of graphite before a melting and kneading process increases, the volume average particle size of graphite particles included in the molded article increases so that thermal conductivity and the molding processability are enhanced. Results of Example 3 and Example 8 show that the ratio of heat sink thickness/gate thickness of two or more improved the thru-plane thermal conductivity of the base of the heat sink. Accordingly, heat of the LED module can be efficiently transferred to the fin part so that the temperature of the LED module can be more effectively reduced.

The automotive LED lamp heat sink according to one or more embodiments of the present invention has high thermal conductivity, high molding processability, and low specific gravity, and thus, can replace metals having high thermal conductivities and other such materials, is lightweight and highly flexible in shape, and can be easily produced at low costs. In addition, the automotive LED lamp heat sink according to one or more embodiments of the present invention has good anti-fogging properties and excellent ultrasonic weldability, provides small fogging on lamp lenses, can be easily combined with other base materials, and can have physical properties enhanced in accordance with its application. The thermally conductive resin composition according to the present invention has a high electromagnetic shielding property, and is suitable for applications requiring electromagnetic shielding. For the foregoing reasons, the thermally conductive resin composition according to one or more embodiments of the present invention is suitably applicable to an automotive LED lamp heat sink.

Although the disclosure has been described with respect to only a limited number of embodiments, those skilled in the art, having benefit of this disclosure, will appreciate that various other embodiments may be devised without departing from the scope of the present invention. Accordingly, the scope of the present invention should be limited only by the attached claims.

DESCRIPTION OF REFERENCE NUMERALS AND SIGNS

1: LED module
2: circuit board
3: base of heat sink
4: fins of heat sink
5: gate
6: heat sink upper surface
7: rib
8: highly thermally conductive metal member

What is claimed is:

1. An automotive LED lamp heat sink comprising:
   a thermally conductive resin composition, wherein a part or the entirety of the heat sink is formed by injection molding of the thermally conductive resin composition, the thermally conductive resin composition comprising at least:
   50 to 90 weight % of a thermoplastic polyester resin having a number average molecular weight of 12,000 to 70,000, and
   10 to 50 weight % of a flaked graphite having a fixed carbon content of at least 98 mass % and an aspect ratio of at least 21, and wherein the thermally conductive resin composition has a specific gravity of 1.4 to 1.7 and an in-plane thermal conductivity of at least 1 W/(m·K).

2. The automotive LED lamp heat sink according to claim 1, wherein the flaked graphite has a volume-average particle size of 1 to 500 μm.

3. The automotive LED lamp heat sink according to claim 1, wherein
   the thermally conductive resin composition is produced by melting and kneading, and
   the flaked graphite, prior to the melting and kneading, has a volume-average particle size of 1 to 700 μm, a fixed carbon content of at least 98 mass %, and an aspect ratio of at least 21.

4. The automotive LED lamp heat sink according to claim 1, wherein the thermoplastic polyester resin is one or more resins selected from the group consisting of polybutylene terephthalate, polyethylene terephthalate, and polyester-polyether copolymers.

5. The automotive LED lamp heat sink according to claim 1, wherein the thermally conductive resin composition has a thru-plane thermal conductivity of at least 0.5 W/(m·K).

6. The automotive LED lamp heat sink according to claim 1, wherein a portion of the automotive LED lamp heat sink is one of a highly thermally conductive metal or a carbon material.

7. The automotive LED lamp heat sink according to claim 6, wherein the highly thermally conductive metal is a metal selected from the group consisting of aluminum, copper, magnesium, and alloys thereof, and has a thermal conductivity of at least 40 W/(m·K).

8. The automotive LED lamp heat sink according to claim 1, wherein the LED lamp heat sink, being formed from a highly thermally conductive metal and the thermally conductive resin composition, is fixedly joined to a highly thermally conductive metal by insert molding, ultrasonic welding, or thermal welding on a heat receiving surface composed from the thermally conductive resin composition.

9. The automotive LED lamp heat sink according to claim 8, wherein the highly thermally conductive metal is a metal selected from the group consisting of aluminum, copper, magnesium, and alloys thereof, and has a thermal conductivity of at least 40 W/(m·K).

10. The automotive LED lamp heat sink according to claim 6, wherein the carbon material is a graphite sheet, and has an in-plane thermal conductivity of at least 500 W/(m·K).

11. The automotive LED lamp heat sink according to claim 6, wherein the automotive LED lamp heat sink comprises:

the highly thermally conductive metal, a thermal interface material, and the thermally conductive resin composition, wherein the thermal interface material has a thermal conductivity of at least 0.5 W/(m·K).

12. The automotive LED lamp heat sink according to claim 1, wherein a portion of the automotive LED lamp heat sink is made of a resin composition including an insulating resin.

13. The automotive LED lamp heat sink according to claim 1, wherein a ratio of a base thickness to a gate thickness is two or more, wherein the base thickness is a thickness of a base portion of the heat sink, and the gate thickness is a thickness of a gate in a die for injection molding of the heat sink.

14. The automotive LED lamp heat sink according to claim 13, wherein the automotive LED lamp heat sink includes two or more gate marks.

15. An automotive LED rear-lamp heat sink as set forth in claim 1.

16. An automotive LED front-lamp heat sink as set forth in claim 1.

17. An automotive LED head-lamp heat sink as set forth in claim 1.

\* \* \* \* \*